United States Patent
Lin et al.

(10) Patent No.: US 9,093,314 B2
(45) Date of Patent: Jul. 28, 2015

(54) COPPER BUMP STRUCTURES HAVING SIDEWALL PROTECTION LAYERS

(71) Applicant: Taiwan Semiconductor Manufacturing Company, Ltd., Hsin-Chu (TW)

(72) Inventors: Jing-Cheng Lin, Hsin-Chu (TW); Ya-Hsi Hwung, Hsin-Chu (TW); Hsin-Yu Chen, Taipei (TW); Po-Hao Tsai, Zhongli (TW); Yan-Fu Lin, Zhubei (TW); Cheng-Lin Huang, Hsin-Chu (TW); Fang Wen Tsai, Hsin-Chu (TW); Wen-Chih Chiou, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/579,326

(22) Filed: Dec. 22, 2014

(65) Prior Publication Data

US 2015/0111342 A1 Apr. 23, 2015

Related U.S. Application Data

(62) Division of application No. 12/846,260, filed on Jul. 29, 2010, now Pat. No. 8,922,004.

(60) Provisional application No. 61/353,801, filed on Jun. 11, 2010.

(51) Int. Cl.
*H01L 21/4763* (2006.01)
*H01L 23/00* (2006.01)

(52) U.S. Cl.
CPC .............. *H01L 24/11* (2013.01); *H01L 24/81* (2013.01); *H01L 2224/1191* (2013.01); *H01L 2224/81801* (2013.01); *H01L 2924/014* (2013.01); *H01L 2924/01029* (2013.01)

(58) Field of Classification Search
CPC . H01L 24/11; H01L 24/81; H01L 224/81801; H01L 224/01029; H01L 224/014; H01L 224/1191
USPC .......................... 438/106, 411, 461, 611, 613
See application file for complete search history.

(56) References Cited

U.S. PATENT DOCUMENTS

| | | | |
|---|---|---|---|
| 6,218,281 B1 | 4/2001 | Watanabe et al. |
| 6,229,220 B1 | 5/2001 | Saitoh et al. |
| 6,578,754 B1 | 6/2003 | Tung |
| 6,592,019 B2 | 7/2003 | Tung |
| 6,818,545 B2 | 11/2004 | Lee et al. |
| 6,853,076 B2 | 2/2005 | Datta et al. |
| 6,917,119 B2 | 7/2005 | Lee et al. |
| 7,064,436 B2 | 6/2006 | Ishiguri et al. |
| 7,391,112 B2 | 6/2008 | Li et al. |
| 7,485,564 B2 | 2/2009 | Daubenspeck et al. |

(Continued)

FOREIGN PATENT DOCUMENTS

| | | |
|---|---|---|
| JP | 5335313 | 12/1993 |
| JP | 2000228420 | 8/2000 |

*Primary Examiner* — Hoa B Trinh
(74) *Attorney, Agent, or Firm* — Slater & Matsil, L.L.P.

(57) ABSTRACT

A work piece includes a copper bump having a top surface and sidewalls. A protection layer is formed on the sidewalls, and not on the top surface, of the copper bump. The protection layer includes a compound of copper and a polymer, and is a dielectric layer.

20 Claims, 7 Drawing Sheets

(56) References Cited

U.S. PATENT DOCUMENTS

| | | |
|---|---|---|
| 7,652,374 B2 | 1/2010 | Kok et al. |
| 7,969,003 B2 | 6/2011 | Huang |
| 2008/0185716 A1 | 8/2008 | Huang |
| 2008/0194095 A1 | 8/2008 | Daubenspeck et al. |
| 2009/0149016 A1 | 6/2009 | Park et al. |
| 2011/0049705 A1 | 3/2011 | Liu et al. |
| 2011/0101521 A1 | 5/2011 | Hwang et al. |
| 2011/0254151 A1* | 10/2011 | Lin et al. .............. 257/737 |
| 2011/0260317 A1* | 10/2011 | Lu et al. .............. 257/737 |

* cited by examiner

COPPER BUMP STRUCTURES HAVING SIDEWALL PROTECTION LAYERS

PRIORITY CLAIM

This application claims priority to and is a divisional of U.S. patent application Ser. No. 12/846,260, filed on Jul. 29, 2010 and entitled "Copper Bump Structures Having Sidewall Protection Layers," which application claims priority to U.S. Provisional Patent Application Ser. No. 61/353,801, filed on Jun. 11, 2010, and entitled "Sidewall Protection Layers in Copper Bump Structures," both of which applications are herein incorporated by reference.

TECHNICAL FIELD

This disclosure relates generally to integrated circuits, and more particularly to copper bump structures having protection layers on sidewalls.

BACKGROUND

Die-to-wafer bonding is a commonly used bonding method, wherein semiconductor dies sawed from wafers are bonded to semiconductor chips in un-sawed wafers. With the die-to-wafer bonding, known-good-dies may be selected and bonded to wafers. The yield is thus improved over that of wafer-to-wafer bonding.

The conventional die-to-wafer bonding methods suffer from drawbacks. A wafer may include many chips (referred to as bottom chips hereinafter), sometimes as many as one thousand chips or more. Accordingly, more than one thousand top dies need to be bonded to the bottom chips one by one. This may take up to two hours. During the entire period of the bonding process, the wafer needs to be heated. The temperature of the wafer, however, is difficult to control. If the temperature is high, the copper bumps in the bottom chips suffer from serious oxidation, and the flux applied on the bottom chips may be baked/evaporated. On the other hand, if the temperature is low, cold joints may be formed. As such, the yield of the die-to-wafer bonding is adversely affected.

SUMMARY

In accordance with one aspect, a work piece includes a copper bump having a top surface and sidewalls. A protection layer is formed on the sidewalls, and not on the top surface, of the copper bump. The protection layer includes a compound of copper and a polymer, and is a dielectric layer.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel bump structure and the method of forming the same are provided. The intermediate stages of manufacturing an embodiment are illustrated. The variations of the embodiments are discussed. Throughout the various views and illustrative embodiments, like reference numbers are used to designate like elements.

Figure 1:
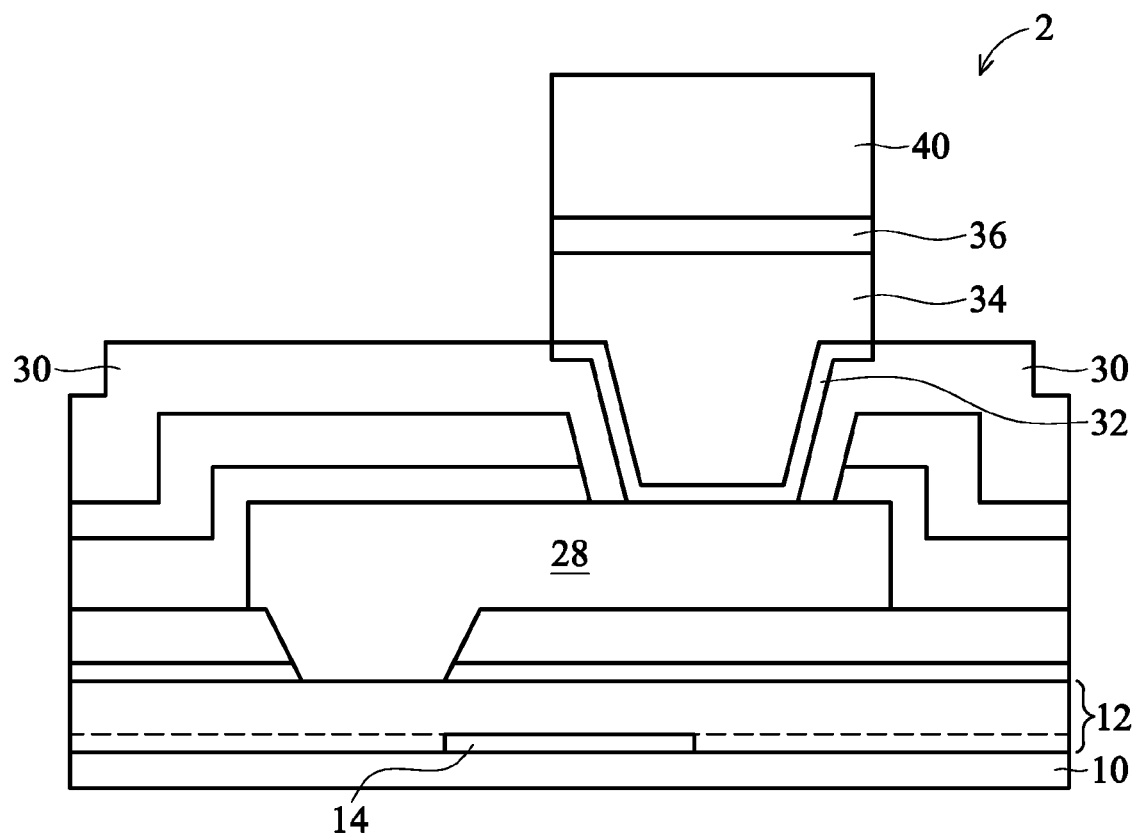
FIGS. 1 through 4 are cross-sectional views of intermediate stages in the formation of a bump structure comprising a solder cap in accordance with various embodiments.

Referring to FIG. 1, work piece 2, which includes substrate 10, is provided. Work piece 2 may be a device die that includes active devices such as transistors therein, although it may also be a package substrate or an interposer that does not have active devices therein. In an embodiment wherein work piece 2 is a device die, substrate 10 may be a semiconductor substrate such as a silicon substrate, although it may include other semiconductor materials. Semiconductor devices 14 such as transistors may be formed at a surface of substrate 10. Interconnect structure 12, which includes metal lines and vias (not shown) formed therein and connected to semiconductor devices 14, is formed over substrate 10. The metal lines and vias may be formed of copper or copper alloys, and may be formed using the well-known damascene processes. Interconnect structure 12 may include a commonly known inter-layer dielectric (ILD) and inter-metal dielectrics (IMDs). For simplicity, substrate 10, interconnect structure 12, and semiconductor devices 14 are not shown in subsequent drawings, although they may exist in each of the figures.

Metal pad 28 is formed over interconnect structure 12. Metal pad 28 may comprise aluminum (Al), copper (Cu), silver (Ag), gold (Au), nickel (Ni), tungsten (W), alloys thereof, and/or multi-layers thereof. Metal pad 28 may be electrically coupled to semiconductor devices 14, for example, through the underlying interconnect structure 12. Passivation layers, which may include one or more dielectric layers including passivation layer 30 may be formed to cover portions of metal pad 28. In an exemplary embodiment, passivation layer 30 is formed of polyimide or other known dielectric materials. The passivation layers may also have a composite structure including a silicon oxide layer, a silicon nitride layer, a polyimide layer, and the like.

Under-bump-metallurgy (UBM) 32 is formed on, and electrically connected to, metal pad 28. UBM 32 may include a titanium layer and a copper layer over the titanium layer (not shown). Copper bump 34, which may be formed of substantially pure copper or a copper alloy, is formed on UBM 32. In an embodiment, copper bump 34 is formed by plating. An exemplary plating process includes forming a blanket UBM layer (not shown, wherein UBM 32 is a part of the blanket UBM layer), forming a mask (not shown) on the UBM layer, patterning the mask to form an opening, plating copper bump 34 into the opening, and removing the mask and the portion of the UBM layer previously covered by the mask. Copper bump 34 may be formed of substantially pure copper or copper alloys.

Non-copper metal layer 36, which is free from or substantially free from copper, is formed on the top surface of copper bump 34, and may be formed of metal materials selected from Ni, Co, Sn, Pd, Bi, Ag, Cd, Au, Zn, and combinations thereof. Solder cap 40 may be formed on non-copper metal layer 36, and may comprise a lead-free solder material containing, for example, SnAg, SnAgCu, or the like, although solder cap 40 may also be formed of an eutectic solder material containing, for example, lead (Pb) and tin (Sn).

Figure 2:
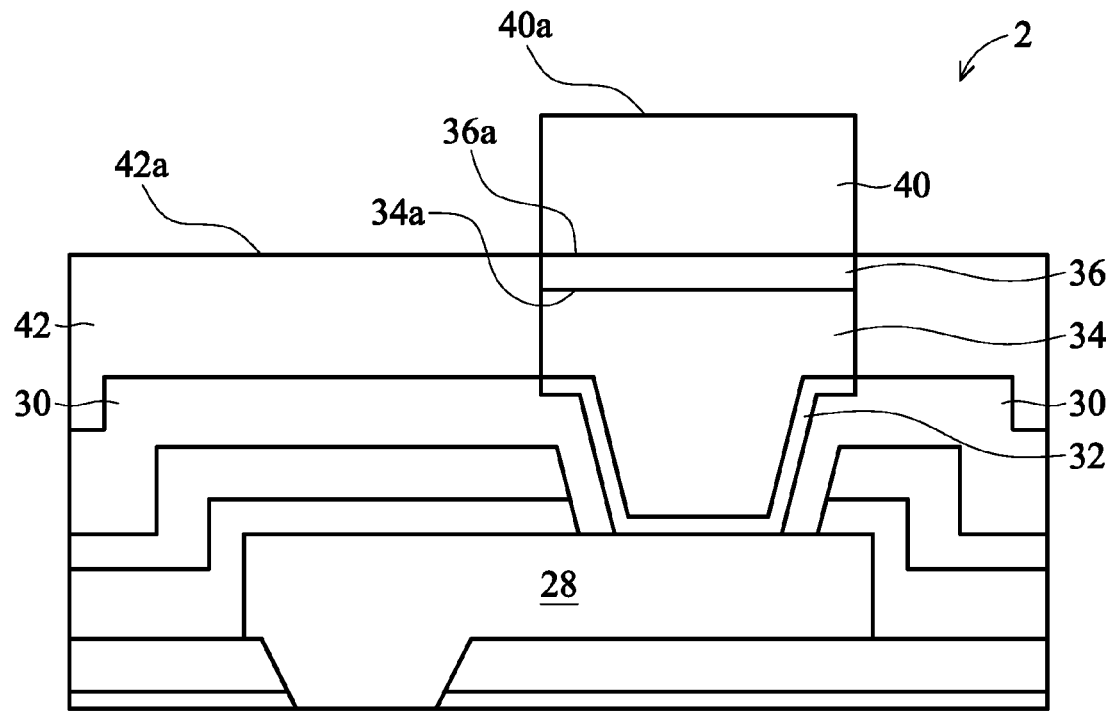

Referring to FIG. 2, polymer layer 42 is formed, for example, by coating. Top surface 42a of polymer layer 42 may be higher than top surface 34a of copper bump 34, and may be higher or lower than top surface 36a of non-copper metal layer 36. Further, top surface 42a of polymer layer 42 may be higher or lower than top surface 40a of solder cap 40. Polymer layer 42 may be formed of a photo-sensitive material, which may be a photo resist and/or polyimide. Further, the material of polymer layer 42 is selected so that it can react with copper, but does not react with non-copper metal layer 36. The usable material of polymer layer 42 thus includes, but is not limited to, benzene-based polymers, dioxane-based polymers, toluene-based polymers, phenylthiol-based polymers, phenol-based polymers, cyclohexane-based polymers, p-Cresol-based polymers, and the like. Exemplary materials of polymer layer 42 include polybenzoxazole (PBO), polyimide, 2,3-Dimethylphenol, 2,4-Dimethylphenol, 2,6-Dimethylphenol, 3,4-Dimethylphenol, 1,3,5-xylenol, p-Ethylphenol, and the like.

Figure 3:
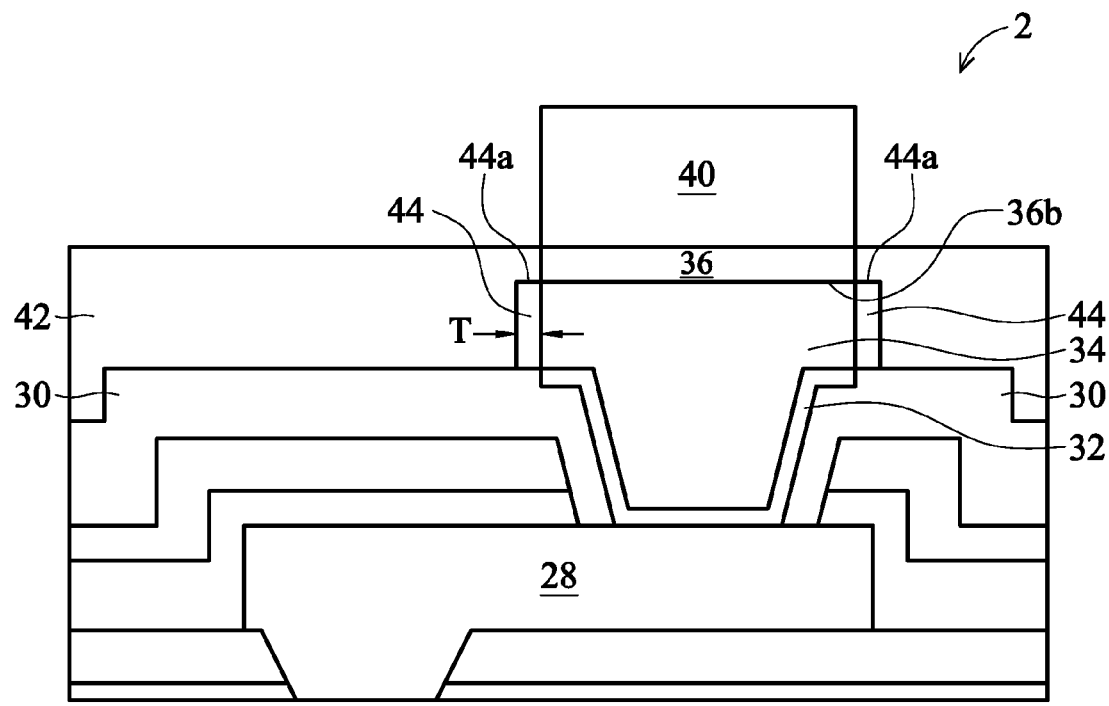

Referring to FIG. 3, after the coating of polymer layer 42, polymer layer 42 is exposed to light, followed by a curing step. The curing is performed at a low-temperature, which may be lower than about 190° C., and may be between about 150° C. and about 190° C., for example. The duration of the curing may be between about one hour and two hours, although different temperatures and durations may be used. With the low-temperature curing, the underlying passivation layer 30, which may be formed of a polyimide, is not damaged. During the curing step, polymer layer 42 reacts with copper in the surface portion of copper bump 34 where they contact to form protection layer 44, which is a copper-containing polymer-based dielectric layer comprising a copper-containing polymer-based compound. In an embodiment, the thickness of protection layer 44 is between about 5 nm and about 500 nm. Further, protection layer 44 may have a substantially uniform thickness T. Protection layer 44 is limited on the sidewalls of copper bump 34, with no portion of protection layer 44 extending horizontally on the top surface of passivation layer 30. Further, protection layer 44 encircles copper bump 34.

Polymer layer 42 does not react with non-copper metal layer 36. As a result, no protection layer 44 is formed on the top surface and edges of non-copper metal layer 36. Further, the top edge 44a of protection layer 44 is substantially level with the top surface 34a of copper bump 34, and is substantially level with bottom surface 36b of non-copper metal layer 36. Protection layer 44 has the function of protecting copper bump 34 from the oxidation in the die-to-wafer bonding process.

Figure 4:
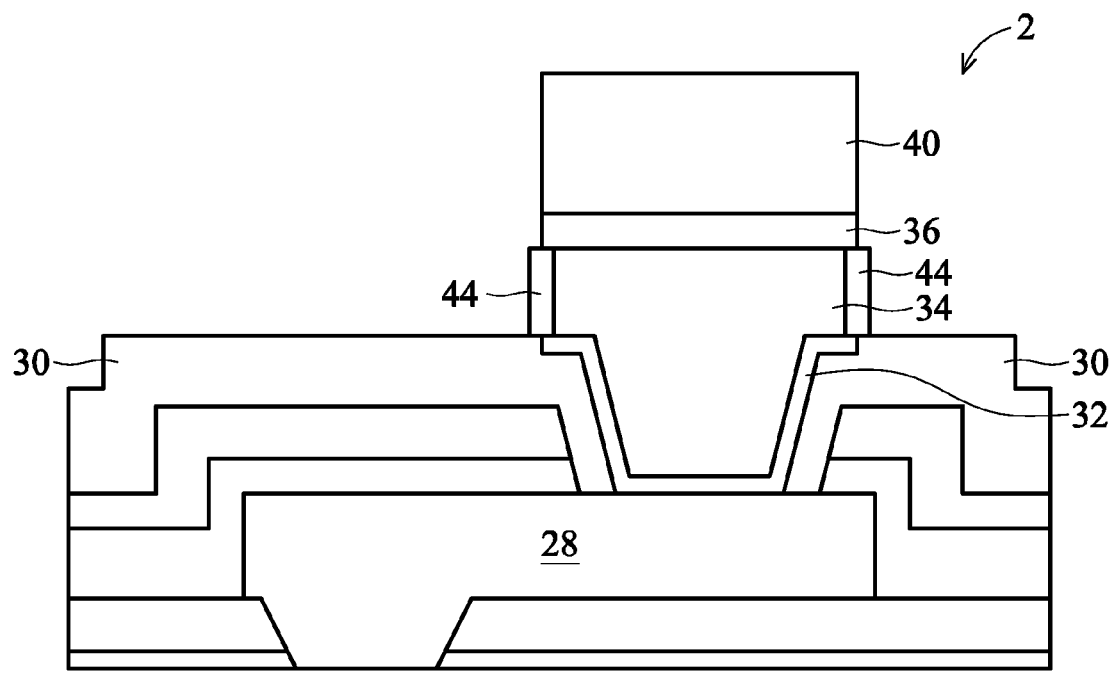

FIG. 4 illustrates the removal of polymer layer 42. During the removal of polymer layer 42, the underlying passivation layer 30 is not removed. It is noted that even if polymer layer 42 and passivation layer 30 are formed of a same photo resist, passivation layer 30 can still remain not removed since it may have been cured in preceding process steps before they are exposed to light. Further, passivation layer 30 and polymer layer 42 may also be formed of different materials. In the resulting structure, protection layer 44 exists on the sidewalls, but not on the top surface, of copper bump 34.

Figure 5:
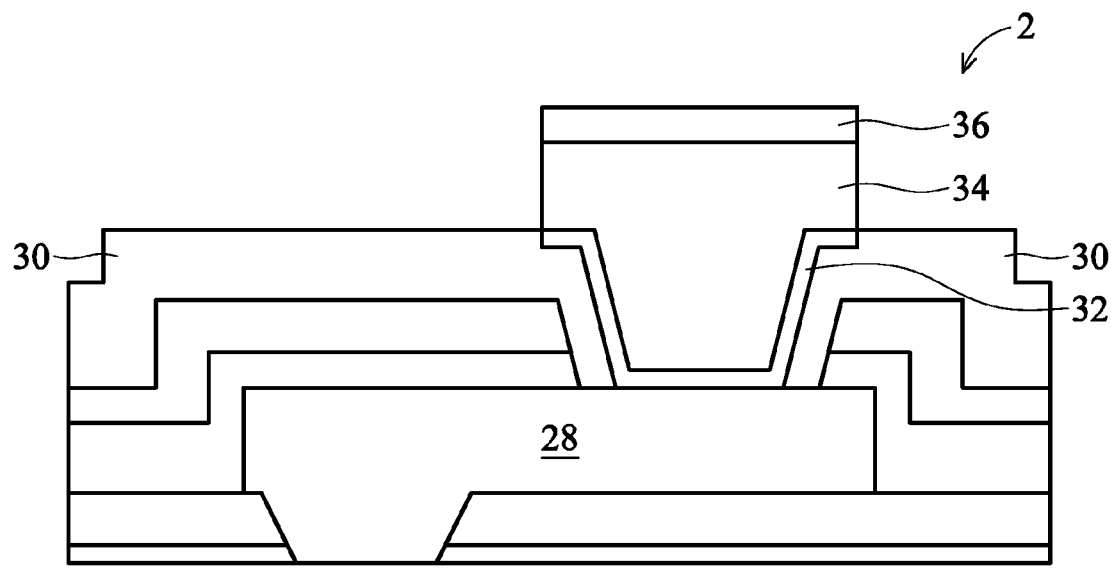
FIGS. 5 through 9 are cross-sectional views of intermediate stages in the formation of a bump structure comprising no solder cap in accordance with alternative embodiments.
Figure 6:
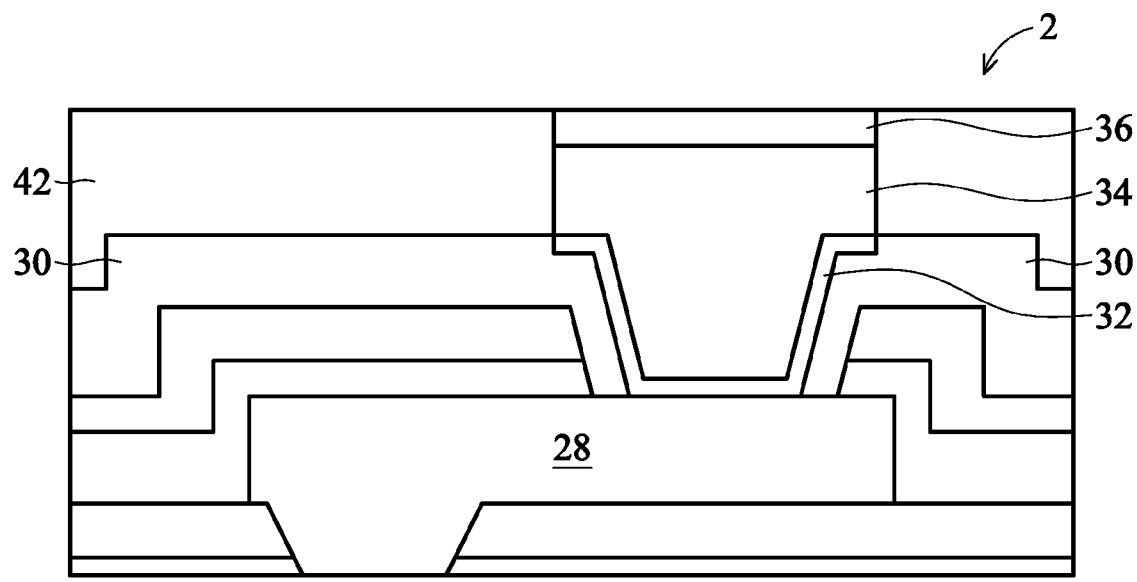
Figure 7:
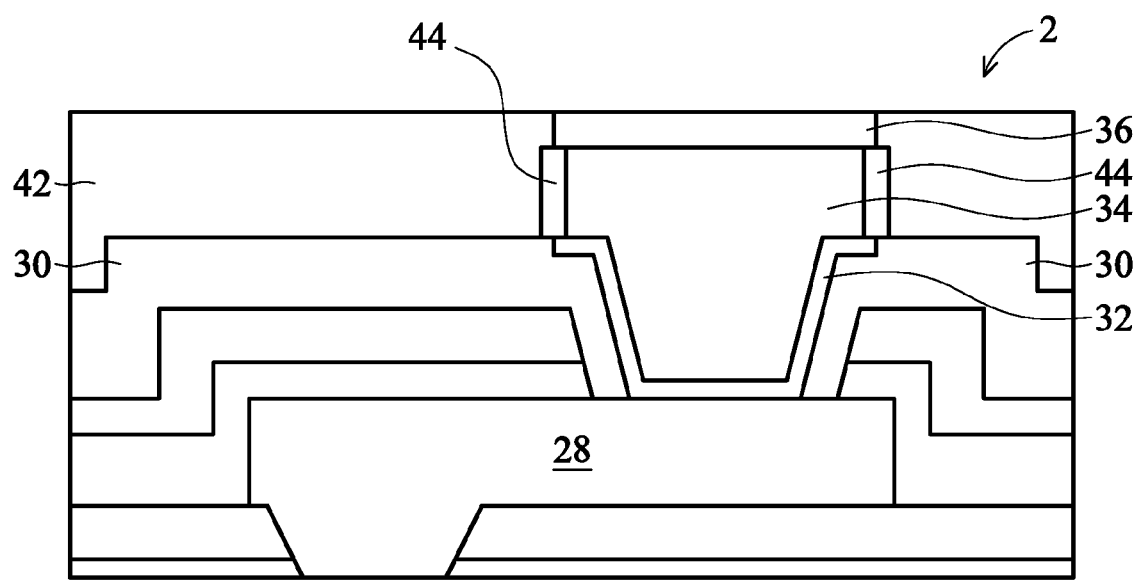
Figure 8:
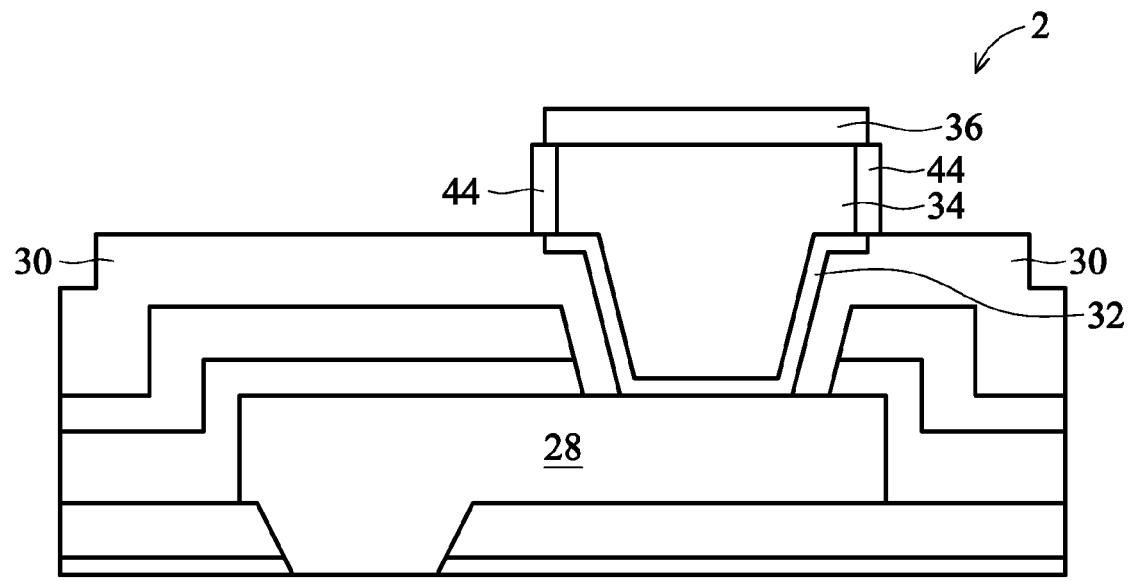

FIGS. 5 through 9 illustrate the formation of a bump structure in accordance with alternative embodiments. Unless specified otherwise, the reference numerals in these embodiments represent like elements in the embodiments illustrated in FIGS. 1 through 4. The process steps and materials shown in FIGS. 5 through 8 are essentially the same as in FIGS. 1 through 4, except no solder cap 40 (FIG. 1) is formed on the top surface of non-copper metal layer 36. The process details and materials involved in FIGS. 5 and 8 are briefly discussed as follows.

In FIG. 5, the initial structure including UBM 32, copper bump 34, and non-copper metal layer 36 is provided. Next, in FIG. 6, polymer layer 42 is coated, and is exposed and cured, so that protection layer 44 is formed, as shown in FIG. 7. Next, as shown in FIG. 8, the un-reacted portion of polymer layer 42 is removed.

Figure 9:
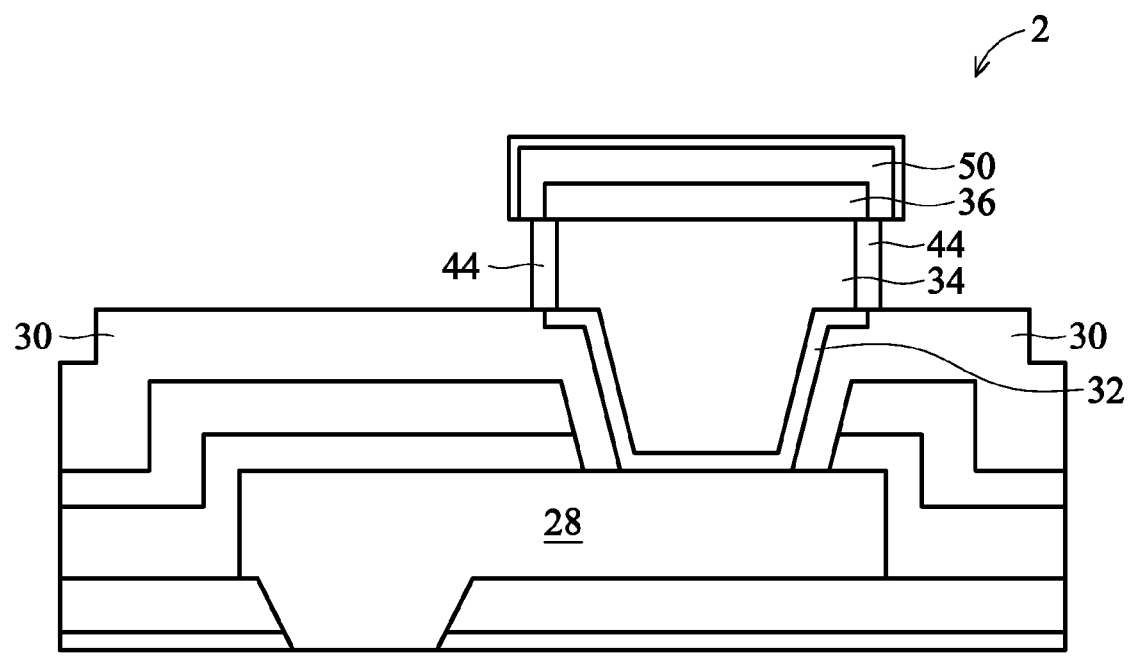

Referring to FIG. 9, metal finish 50 is formed on non-copper metal layer 36, for example, by electro-less plating. Metal finish 50 may have a single-layer structure or a composite structure including a plurality of sub-layers formed of different materials. In an embodiment, metal finish 50 is formed of electroless nickel electroless palladium immersion gold (ENEPIG), which includes a nickel layer, a palladium layer on the nickel layer, and a gold layer on the palladium layer. The gold layer may be formed using immersion plating. In other embodiments, metal finish 50 may be formed of other known finish materials and methods, including, but not limited to, electroless nickel immersion gold (ENIG), direct immersion gold (DIG), or the like. Metal finish 50 is selectively formed directly on the top surface and sidewalls of non-copper metal layer 36, and is not formed on sidewalls of protection layer 44.

Figure 10A:
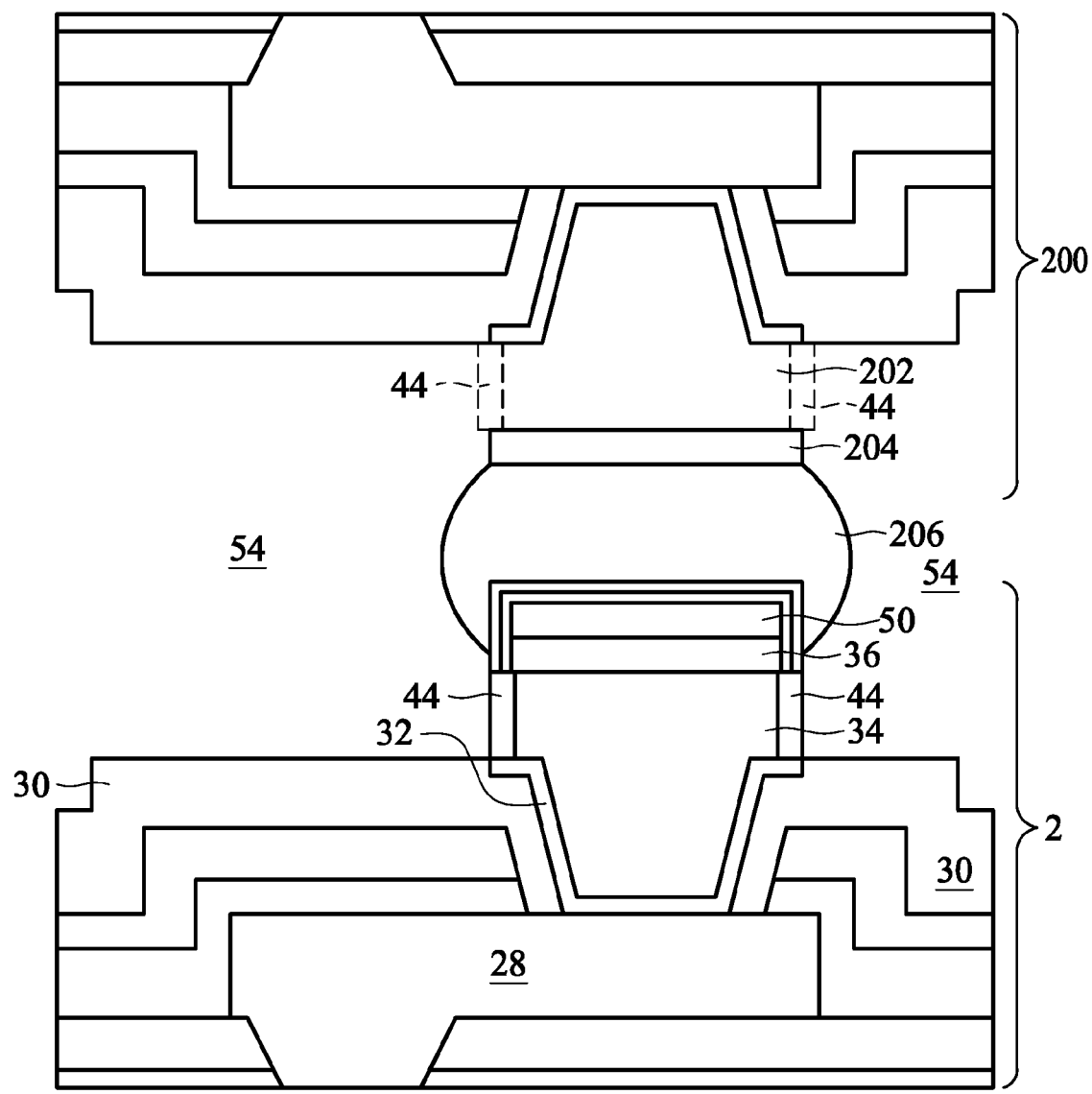
FIGS. 10A and 10B are cross-sectional views of bonded work pieces.
Figure 10B:
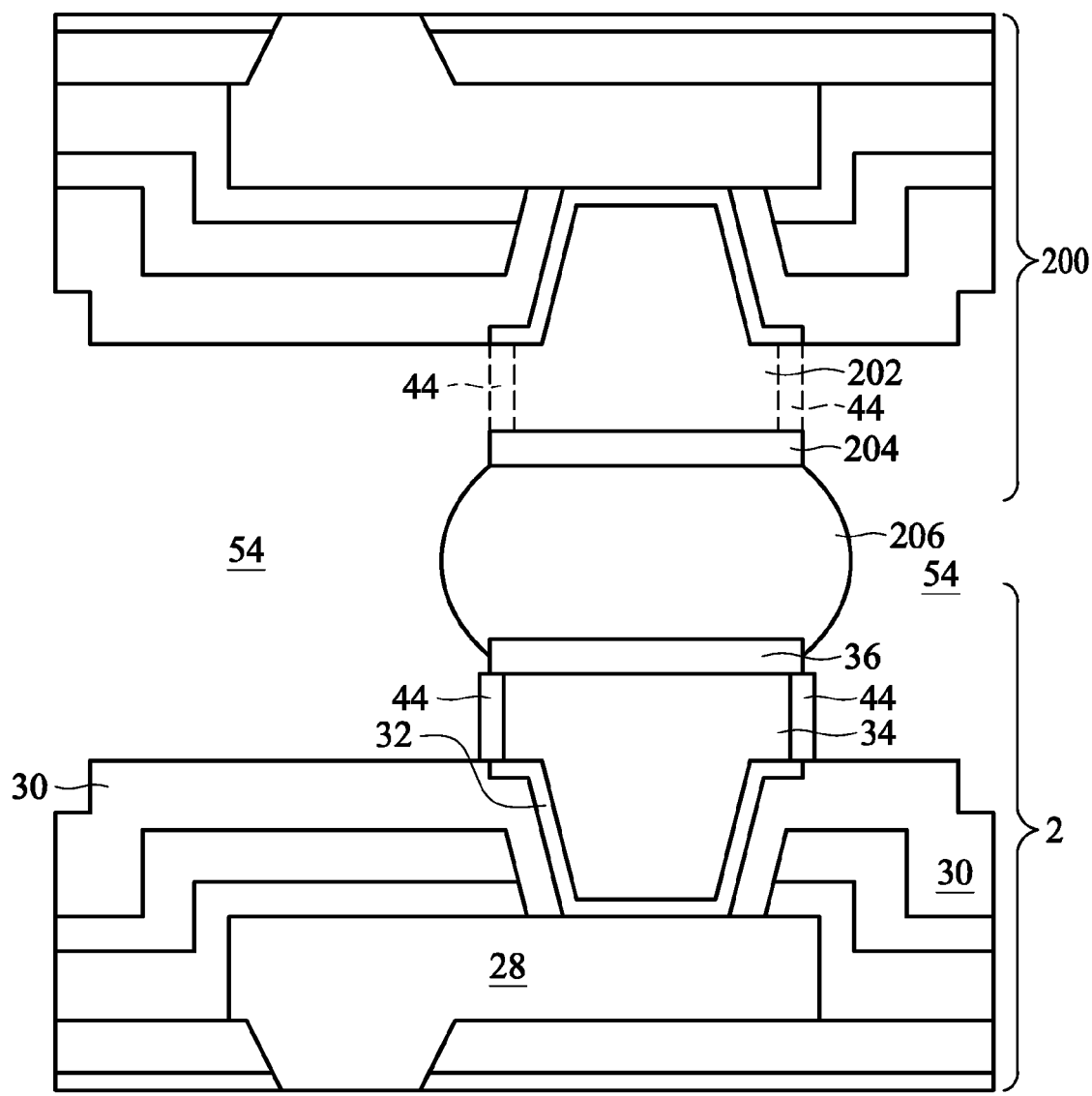

FIG. 10A illustrates the bonding of work piece 2 (as shown in FIG. 9) and work piece 200. FIG. 10B illustrates the bonding of work piece 2 (as shown in FIG. 5) with work pieces 200. Work piece 2 may be inside an un-sawed wafer, while work piece 200 may be a discrete die already sawed from the respective wafer. The bonding is thus a die-to-wafer bonding. Work piece 200 may be a device die, an interposer, a package substrate, or the like. Work piece 200 may include metal bumps such as copper pillar bumps or solder bumps. In an embodiment, as shown in FIGS. 10A and 10B, work piece 200 includes copper pillar bump 202, and barrier layer (such as a nickel layer) 204 on a surface of copper pillar bump 202. Solder region 206 joins barrier layer 204 and copper pillar bump 202 to non-copper metal layer 36 (or metal finish 50, if any), wherein the joining may be achieved through the reflow of solder region 206. After the bonding of work pieces 2 and 200, underfill 54 is filled into the gap between work pieces 2 and 200. Protection layer 44 thus may separate copper bump 34 from underfill 54, with no underfill 54 contacting copper bump 34. Further, polymer layer 42 (FIGS. 2 and 6) and underfill 54 may be formed of different materials.

Since protection layer 44 is not wettable to solder, during the die-to-wafer bonding process, even if the temperature of work piece 2 (and the respective wafer) is high, the solder in solder region 206 will not slip to the surface of protection layer 44. Solder region 206 thus remain on the surface of metal finish 50 (or non-copper metal layer 36), which has good wettability to solder. Accordingly, the volume of solder region 206 is easy to control. This also reduces the possible shorting between neighboring bump structures due to the reduction in the lateral expansion of solder region 206. Further, in the die-to-wafer bonding process, protection layer 44 prevents copper bump 34 from oxidation even if the temperature of work piece 2 is high. Accordingly, no flux needs to be applied on the sidewalls of copper bump 34.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a polymer layer on sidewalls of a conductive bump disposed on a first work piece, the conductive bump comprising a first metal and the polymer layer comprising a polymer material; and
   forming a protection layer on the sidewalls by curing the polymer layer, wherein the protection layer is a dielectric comprising a compound of the first metal and the polymer material;
   wherein the conductive bump extends below a bottommost surface of the protection layer; and
   wherein the protection layer covers the sidewalls of the conductive bump above the work piece, a top surface of the conductive bump being exposed through the protection layer.

2. The method of claim 1 wherein the polymer layer comprises at least one of polyimide and a photo resist.

3. The method of claim 1 further comprising, before the step of forming the polymer layer, forming a non-copper metal layer over and contacting the top surface of the conductive bump.

4. The method of claim 3 further comprising, before the step of forming the polymer layer, forming a solder cap over and contacting the non-copper metal layer.

5. The method of claim 3 further comprising, after the step of forming the protection layer, forming a metal finish contacting a top surface and sidewalls of the non-copper metal layer, wherein substantially no portion of the metal finish is formed on the protection layer.

6. The method of claim 1 further comprising bonding a second work piece to the first work piece, and filling an underfill between the first and the second work pieces, wherein the underfill contacts the protection layer.

7. The method of claim 1 wherein the step of forming a polymer layer on sidewalls of a conductive bump includes forming the conductive bump on an opening of a passivation layer, the conductive bump extending above the opening and coating the conductive bump with the polymer layer.

8. The method of claim 7 further comprising exposing the polymer layer to light prior to curing the polymer layer.

9. A method comprising:
   providing a device comprising a dielectric layer and a conductive bump on the dielectric layer, the conductive bump having a top surface and having sidewalls extending above the dielectric layer, wherein a portion of the conductive bump extends into the dielectric layer, and wherein the conductive bump comprises a first metal;
   forming a cap layer over and contacting the top surface of the conductive bump, wherein the cap layer comprises a second metal different from the first metal; and
   forming a protection layer on the sidewalls of the conductive bump, wherein the protection layer comprises a compound of the first metal and a polymer, and wherein the protection layer extends between the top surface of the conductive bump and the top surface of the dielectric layer.

10. The method of claim 9, wherein the first metal comprises copper and the cap layer is a non-copper metal.

11. The method of claim 9 wherein the step of forming a protection layer on the sidewalls of the conductive bump includes coating the conductive bump with a polymer layer, exposing the polymer layer to light, and curing the polymer layer.

12. The method of claim 11 further comprising removing the polymer layer after the step of forming a protection layer on the sidewalls of the conductive bump.

13. The method of claim 11 further comprising before the step of forming the polymer layer, forming a solder layer over the cap layer.

14. The method of claim 9 further comprising, after the step of forming the protection layer, forming a metal finish contacting a top surface and sidewalls of the cap layer, wherein substantially no portion of the metal finish is formed on the protection layer.

15. The method of claim 9 further comprising bonding a second device to the device, and filling an underfill between the device and the second device, wherein the underfill contacts the protection layer.

16. The method of claim 9 further comprising bonding a plurality of second devices to the device.

17. A method comprising:
    providing a work piece having a conductive bump disposed thereon, the conductive bump having a top surface and sidewalls, a first portion of the sidewalls extending above a top surface of the work piece, wherein the conductive bump comprises a first metal;
    applying a polymer layer on first portion of the sidewalls; and
    forming a protection layer on the first portion of the sidewalls by reacting the polymer layer with a material of the conductive bump;
    wherein the protection layer is a dielectric comprising a compound of the first metal and a polymer material of the polymer layer;
    wherein the protection layer has a bottom surface disposed above the top surface of the work piece and wherein the protection layer further has a top surface substantially level with the top surface of the conductive bump; and
    wherein a portion of the conductive bump extends below a bottommost surface of the protection layer and below an uppermost surface of the work piece.

18. The method of claim 17 wherein the step of forming a protection layer on the first portion of the sidewalls by reacting the polymer layer with a material of the conductive bump includes curing the polymer layer after it is applied to the first portion of the sidewalls of the conductive bump.

19. The method of claim 17 further comprising forming a cap layer over and contacting the top surface of the conductive bump, wherein the cap layer comprises a second metal different from the first metal.

20. The method of claim 17 further comprising forming a solder layer above the conductive bump and bonding a second workpiece to the workpiece using the conductive bump and the solder layer.

* * * * *